(12) United States Patent
Kuo et al.

(10) Patent No.: US 11,483,925 B2
(45) Date of Patent: Oct. 25, 2022

(54) CIRCUIT BOARD AND MANUFACTURE METHOD OF THE CIRCUIT BOARD

(71) Applicant: UNIMICRON TECHNOLOGY CORP., Taoyuan (TW)

(72) Inventors: Chun Hung Kuo, Taoyuan (TW); Kuo Ching Chen, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 17/185,216

(22) Filed: Feb. 25, 2021

(65) Prior Publication Data
US 2022/0217841 A1 Jul. 7, 2022

(30) Foreign Application Priority Data
Jan. 7, 2021 (TW) .................................. 110100611

(51) Int. Cl.
*H05K 1/02* (2006.01)
*H05K 1/11* (2006.01)
*H05K 3/20* (2006.01)

(52) U.S. Cl.
CPC .......... *H05K 1/0298* (2013.01); *H05K 1/112* (2013.01); *H05K 1/115* (2013.01); *H05K 1/111* (2013.01);
(Continued)

(58) Field of Classification Search
CPC ........ H05K 1/0298; H05K 3/20; H05K 1/115; H05K 2201/09563; H05K 2201/0195; H05K 1/112; H05K 1/111; H05K 1/185; H05K 2201/0187; H05K 2201/045; H05K 2201/09036; H05K 2201/09045; H05K 2201/09509; H01L 21/4857; H01L 21/486; H01L 23/49822; H01L 23/49827; H01L 23/49833; H01L 23/5383; H01L 23/5384; H01L 24/19
See application file for complete search history.

(56) References Cited

U.S. PATENT DOCUMENTS 5,231,757 A * 8/1993 Chantraine .......... H05K 3/4647
205/125
10,462,902 B1 * 10/2019 Huang ................. H05K 1/0298
(Continued)

FOREIGN PATENT DOCUMENTS

TW I252068 B 3/2006
TW I465160 B 12/2014

*Primary Examiner* — Steven T Sawyer
(74) *Attorney, Agent, or Firm* — WPAT, PC

(57) ABSTRACT

A circuit board is manufactured by mounting a first circuit layer, mounting a conductive bump on the first circuit layer, covering the first circuit layer with a first dielectric layer which exposes the conductive bump, mounting a second dielectric layer on the first dielectric layer with a second dielectric layer opening that exposes the conductive bump, and finally, mounting a second circuit layer on the surface of the second dielectric layer and in the second dielectric layer opening. Since the surface roughness of the second dielectric layer and the second dielectric layer opening is low, it is unlikely to form nano voids between the second dielectric layer and the second circuit layer, and the second circuit layer may be attached to the second dielectric layer firmly, which is an advantage for fine line circuit disposal.

6 Claims, 14 Drawing Sheets

(52) U.S. Cl.
CPC ....... *H05K 3/20* (2013.01); *H05K 2201/0195* (2013.01); *H05K 2201/09563* (2013.01)

(56) References Cited

U.S. PATENT DOCUMENTS

| | | | |
|---|---|---|---|
| 2008/0052905 A1* | 3/2008 | Watanabe | H05K 3/465 29/830 |
| 2009/0056119 A1* | 3/2009 | Okabe | H05K 3/205 174/262 |
| 2010/0175915 A1* | 7/2010 | Mok | H05K 3/4069 174/258 |
| 2011/0094780 A1* | 4/2011 | Uchibori | H05K 1/0265 174/258 |
| 2013/0256000 A1* | 10/2013 | Terui | H05K 3/4694 174/251 |
| 2014/0083745 A1* | 3/2014 | Shimizu | H05K 3/4652 174/251 |
| 2014/0347837 A1* | 11/2014 | Kariya | H05K 3/4694 156/247 |
| 2015/0181703 A1* | 6/2015 | Tanaka | H05K 1/0298 174/251 |
| 2015/0366064 A1* | 12/2015 | Hsu | H05K 1/0298 29/842 |
| 2018/0352658 A1* | 12/2018 | Yang | H01L 24/25 |
| 2019/0341342 A1* | 11/2019 | Raorane | H01L 21/4857 |
| 2020/0365500 A1* | 11/2020 | Huang | H01L 23/49822 |
| 2021/0066156 A1* | 3/2021 | Huang | H01L 23/3128 |

* cited by examiner

CIRCUIT BOARD AND MANUFACTURE METHOD OF THE CIRCUIT BOARD

CROSS-REFERENCE TO RELATED APPLICATIONS

This application claims the priority benefit of TW application serial No. 110100611, filed on Jan. 7, 2021. The entirety of the above-mentioned patent application is hereby incorporated by reference herein and made a part of specification.

BACKGROUND OF THE INVENTION

1. Field of the Invention

The present invention relates to a circuit board and a manufacture method of the circuit board, especially to a multi-layer circuit board and the manufacture method thereof.

2. Description of the Related Art

With reference to FIGS. 4A-4G, the conventional manufacture method of a circuit board includes the following steps: as shown in FIG. 4A, mounting a first circuit layer 42 on a substrate 41, and laminating a dielectric layer 43 on the substrate 41 and the first circuit layer 42 to cover the first circuit layer 42; as shown in FIG. 4B, performing a laser drilling process on the dielectric layer 43 to form a blind hole 430 that connects to a surface of the first circuit layer 42; as shown in FIG. 4C, performing a desmear process to remove a smear left in the blind hole 430; as shown in FIG. 4D, mounting a conductive material layer 44a on the surface 431 of the dielectric layer 43 and in the blind hole 430 of the dielectric layer 43; as shown in FIG. 4E, mounting a patterned photoresist layer 45 on the conductive material layer 44a; as shown in FIG. 4F, mounting a second circuit layer 44 on the conductive material layer 44a and in the blind hole 430; finally, as shown in FIG. 4G, removing the patterned photoresist layer 45, and performing an etching process to separate and accomplish the mounting of the second circuit layer 44.

With reference to FIG. 4B and FIG. 4C, after the laser drilling process, there will be the smear left in the blind hole 430. When the desmear process is performed to remove the smear, the desmear process will simultaneously erode the surface 431 of the dielectric layer 43, and roughness (Ra) of a rough surface 431' of the dielectric layer 43 after the desmear process will be too high. For example, the Ra may be 0.2-0.3 μm. The rough surface 431' of the dielectric layer 43 causes small voids between the conductive material layer 44a, as the seed layer, and the second circuit layer 44. The voids may further develop and become cracks in the remaining manufacture process or in use. The rough surface 431' is a disadvantage for the forming of the second circuit layer 44 if the second circuit layer 44 includes fine line circuit with line spacing or blind hole 430 diameter under 10 μm. The fine line circuit on the rough surface 431' is structurally unreliable and has higher signal loss. Furthermore, as shown in FIG. 5A, which is a partial enlargement drawing of the cross-sectional view in FIG. 4C, the desmear process also erodes the wall in the blind hole 430 and exposes the glass fiber 432 in the dielectric layer 43. FIG. 5B is a partial enlargement drawing of the cross-sectional view in FIG. 4G, wherein the exposed glass fiber 432 increases the risk of conductive anodic filament (CAF) after the conductive material is mounted in the blind hole 430 to form the second circuit layer 44, thus reducing the reliability of the blind hole 430.

On the other hand, 5th Generation (5G) Mobile Communication, as one of the rapidly developing trend technologies in recent years, has the main feature of providing high speed and low latency wireless communication. To meet the required specification of 5G technology, the circuit board in the devices must provide high quality signal transmission with higher frequency and lower noise influence than before. However, since the manufacture method as stated above leads to the defects of rough dielectric layer surface and glass fiber 432 exposure in the blind hole 430, the manufacture method fails to provide circuit boards with stable and high quality circuits. Such circuit board causes signal loss and noise in the transmitted signal, and the risk is even higher in fine line circuits.

In conclusion, the manufacture method of the circuit board needs to be improved.

SUMMARY OF THE INVENTION

An objective of the present invention is to overcome the problems in the conventional circuit board manufacture method. The present invention provides a circuit board and the manufacture method of the circuit board. The manufacture method includes the following steps: providing a substrate; mounting a first circuit layer on the substrate; mounting a conductive bump on the first circuit layer; mounting a first dielectric layer on the substrate, wherein the first dielectric layer covers the first circuit layer and exposes the conductive bump; mounting a second dielectric layer on the first dielectric layer, wherein the second dielectric layer has a second dielectric layer opening; wherein the second dielectric layer opening is formed by a lithography process and is disposed corresponding to the conductive bump, wherein the conductive bump is exposed in the second dielectric layer opening; and mounting a second circuit layer on the second dielectric layer and in the second dielectric layer opening, wherein the second circuit layer is electrically connected to the conductive bump and electrically connected to the first circuit layer through the conductive bump.

In an embodiment of the present invention, the manufacture method includes: mounting a first photoresist layer on the substrate, wherein the first photoresist layer has a first photoresist layer opening that exposes a part of the first circuit layer; mounting the conductive bump in the first photoresist layer opening; and removing the first photoresist layer.

In an embodiment of the present invention, the manufacture method includes: mounting the first dielectric layer on the substrate, wherein the first dielectric layer covers the first circuit layer and the conductive bump; performing a thinning process on the first dielectric layer, wherein the first dielectric layer exposes the conductive bump after the thinning process.

In an embodiment of the present invention, the manufacture method includes: mounting a seed layer on the second dielectric layer and in the second dielectric layer opening; mounting a second photoresist layer on the seed layer, wherein the second photoresist layer has at least one second photoresist layer opening that exposes part of the seed layer and the second dielectric layer opening; mounting the second circuit layer in the second photoresist layer opening and the second dielectric layer opening; removing the second photoresist layer, and performing an etching process to the seed layer and the second circuit layer to separate circuits and accomplish the second circuit layer.

In an embodiment of the present invention, the manufacture method includes: mounting the second dielectric layer on the first dielectric layer, wherein the second dielectric layer covers the first dielectric layer and the conductive bump; performing the lithography process on the second dielectric layer and forming the second dielectric layer opening and a patterned groove.

In an embodiment of the present invention, the manufacture method includes: mounting the second circuit layer in the second dielectric layer opening and the patterned groove.

In an embodiment of the present invention, wherein the circuit board has a fine line mounting area and a thick line mounting area, and the second dielectric layer is mounted in the fine line mounting area.

In an embodiment of the present invention, the manufacture method further includes: mounting a third circuit layer on the first dielectric layer in the thick line mounting area; mounting a third dielectric layer on the first dielectric layer in the fine line mounting area and the thick line mounting area, covering the second dielectric layer and the second circuit layer in the fine line mounting area, and covering the first dielectric layer and the third circuit layer in the thick line mounting area; and mounting a fourth circuit layer on the third dielectric layer.

The circuit board of the present invention includes a first circuit layer; a conductive bump mounted on the first circuit layer; a first dielectric layer, covering the first circuit layer and exposing the conductive bump; a second dielectric layer, covering the second circuit layer and having a second dielectric layer opening; wherein the second dielectric layer opening corresponds to the conductive bump and exposes the conductive bump; a second circuit layer, mounted on the second dielectric layer and in the second dielectric layer opening, and electrically connected to the conductive bump to be electrically connected to the first circuit layer through the conductive bump.

In an embodiment of the present invention, the circuit board has a fine line mounting area and a thick line mounting area; the second dielectric layer is mounted in the fine line mounting area; wherein the circuit board further comprises: a third circuit layer, mounted on the first dielectric layer in the thick line mounting area.

In an embodiment of the present invention, the circuit board further includes a third dielectric layer, mounted on the second dielectric layer and the second circuit layer in the fine line mounting area, and on the first dielectric layer and the third circuit layer in the thick line mounting area; a fourth circuit layer, mounted on the third dielectric layer.

In an embodiment of the present invention, the first circuit layer is mounted on a substrate.

In an embodiment of the present invention, the first circuit layer is buried in the first dielectric layer.

In an embodiment of the present invention, the second circuit layer is buried in the second dielectric layer.

In the manufacture method of the present invention, after the first circuit layer is mounted, the conductive bump is mounted at the location where a conductive pillar needs to be mounted to connect another circuit layer. Then, the first dielectric layer is mounted to cover the first circuit layer but expose the conductive bump. The second dielectric layer is mounted on the first dielectric layer but with opening that exposes the conductive bump. Finally, the second circuit layer is mounted on the second dielectric layer and in the second dielectric layer opening, so that the second circuit layer can be electrically connected to the first circuit layer through the conductive bump at the bottom of the second dielectric layer opening.

The circuit board of the present invention includes two dielectric layers between the first circuit layer and the second circuit layer, wherein the second circuit layer is mounted on the second dielectric layer and in its opening, therefore connecting to the conductive bump in the second dielectric layer opening and to the first circuit layer. Since the second dielectric layer opening is formed by lithography, the surface of the surrounding wall in the second dielectric layer opening is smoother than the surface of a dielectric layer after desmear process. To be more specific, roughness (Ra) of the surface in the second dielectric layer opening is 0.02-0.05 μm, which is only a tenth of the roughness of the rough surface of the dielectric layer after desmear process. Therefore, when the conductive material, as the seed layer for the second circuit layer, is mounted on the second dielectric layer, the conductive material can be attached to the second dielectric layer tightly. The surface of the seed layer is also smoother, which is better for the fine line circuit to be attached.

Furthermore, the manufacture method of the present invention not only makes the second dielectric layer with surface smoother than the surface of a dielectric layer after desmear process, by excluding the laser drilling process and the following desmear process, it also avoids the risk of having glass fiber exposed in the blind hole caused by the desmear process. Therefore, the quality and stability of the circuit layer upon the second dielectric layer and in the second dielectric layer opening are improved. When the circuit board of the present invention is being used in the devices built for 5G communication, it can efficiently reduce the loss of high frequency signals, such that the improved transmitted signals are qualified for the specifications of 5G communication.

DETAILED DESCRIPTION OF THE INVENTION

Figure 1A:
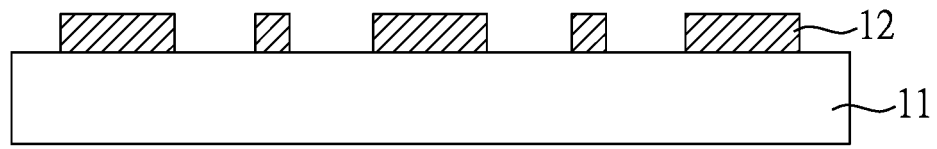
FIGS. 1A-1M are cross-sectional views of a circuit board manufacture method of the present invention.

With reference to FIGS. 1A-1L, the present invention provides a circuit board 10 and the manufacture method of the circuit board 10. The manufacture method includes the following steps: providing a substrate 11; mounting a first circuit layer 12 on the substrate 11; mounting a conductive bump 13 on the first circuit layer 12; mounting a first dielectric layer 14 on the substrate 11, wherein the first dielectric layer 14 covers the first circuit layer 12 and exposes the conductive bump 13; mounting a second dielectric layer 15 on the first dielectric layer 14, wherein the second dielectric layer 15 has a second dielectric layer opening 151; wherein the second dielectric layer opening 151 is formed by a lithography process and is disposed corresponding to the conductive bump 13, such that the conductive bump 13 is exposed in the second dielectric layer opening 151; and mounting a second circuit layer 16 on the second dielectric layer 15 and in the second dielectric layer opening 151, such that the second circuit layer 16 is electrically connected to the conductive bump 13 and electrically connected to the first circuit layer 12 through the conductive bump 13.

The manufacture method will be further illustrated in details below.

As shown in FIG. 1A, firstly, mounting the first circuit layer 12 on the substrate 11.

Figure 1B:
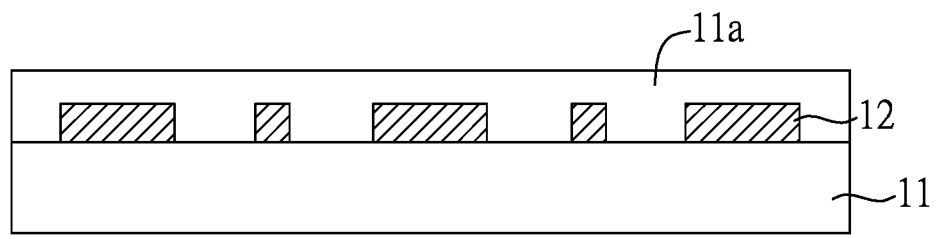
Figure 1C:
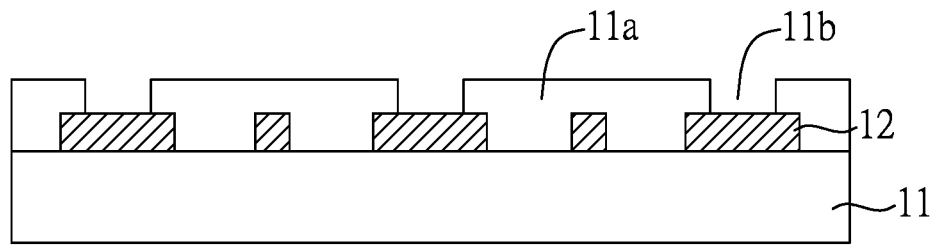
Figure 1D:
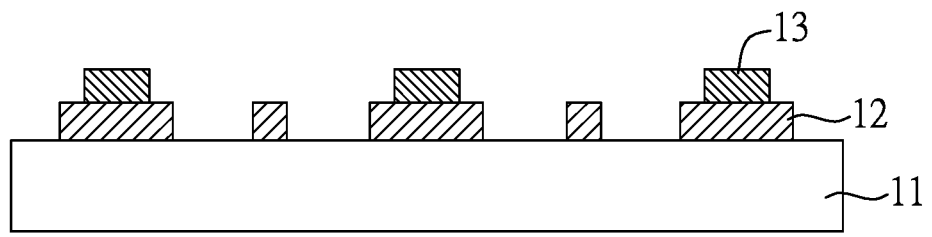

With reference to FIGS. 1B-1D, the step of "mounting the conductive bump 13 on the first circuit layer 12" further includes the following sub-steps: as shown in FIG. 1B, mounting a first photoresist layer 11a on the substrate 11; as shown in FIG. 1C, patterning the first photoresist layer 11a to form a first photoelectric layer opening 11b and exposing part of the first circuit layer 12; as shown in FIG. 1D, mounting the conductive bump 13 in the first photoelectric layer opening, and removing the first photoresist layer 11a to accomplish the conductive bump 13. The conductive bump 13 may be mounted by an electroplating process, for example.

Figure 1E:
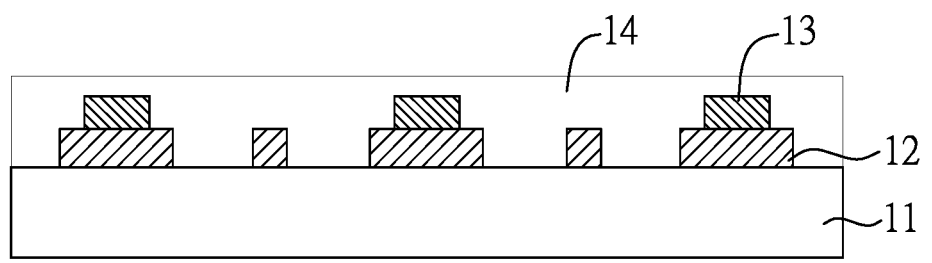
Figure 1F:
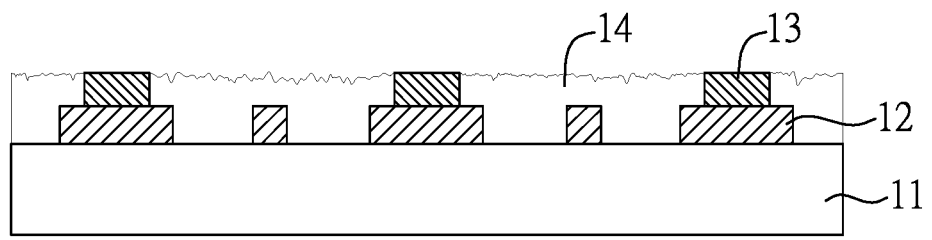

With reference to FIGS. 1E-1F, the step of "mounting a first dielectric layer 14 on the substrate 11, having the first dielectric layer 14 covering the first circuit layer 12 and exposing the conductive bump 13" further includes the following sub-steps: as shown in FIG. 1E, mounting the first dielectric layer 14 on the substrate 11 and covering the first dielectric layer 14 and the conductive bump 13; as shown in FIG. 1F, performing a thinning process to the first dielectric layer 14, such that the first dielectric layer 14 exposes the conductive bump 13.

Preferably, the thinning process of the first dielectric layer 14 is a plasma process utilizing $CF_4$ or $SF_4$ gas, a desmear process, a physical or chemical grinding process, etc.

Figure 1G:
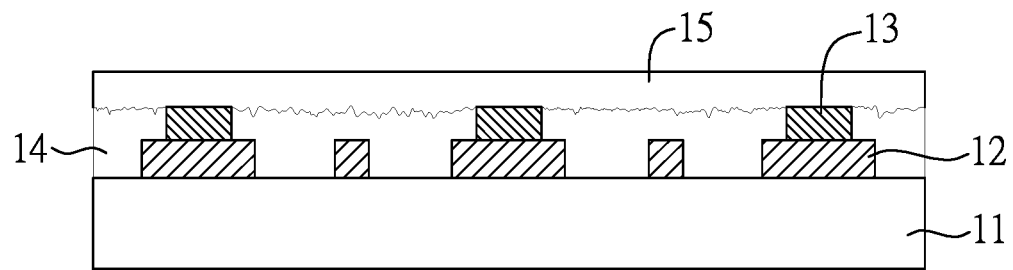
Figure 1H:
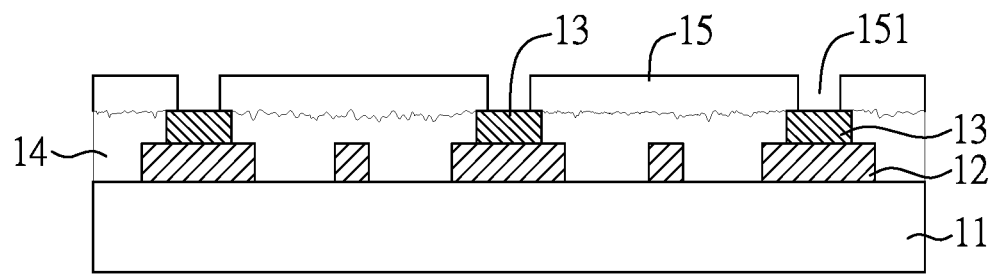

With reference to FIGS. 1G-1H, in the step of "mounting a second dielectric layer 15 on the first dielectric layer 14, wherein the second dielectric layer 15 has a second dielectric layer opening 151 wherein the second dielectric layer opening 151 is formed by a lithography process, and is disposed corresponding to the conductive bump 13, such that the conductive bump 13 is exposed in the second dielectric layer opening 151" further includes the following sub-steps: as shown in FIG. 1G, mounting the second dielectric layer 15 on the first dielectric layer 14, such that the second dielectric layer 15 covers the first dielectric layer 14 and the conductive bump 13; as shown in FIG. 1H, performing a lithography process to the second dielectric layer 15 to form the second dielectric layer opening 151.

Figure 1I:
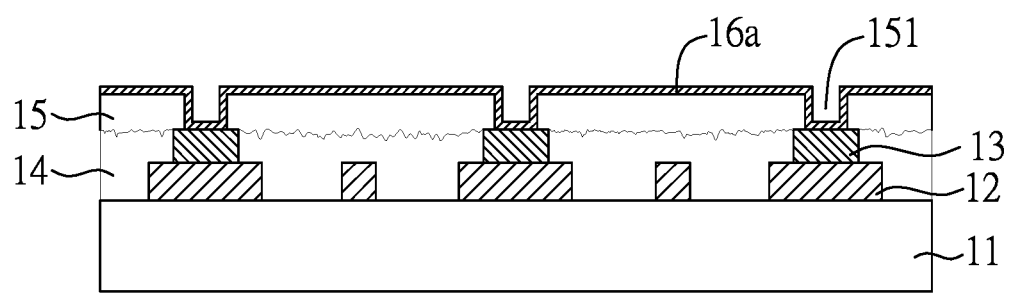
Figure 1J:
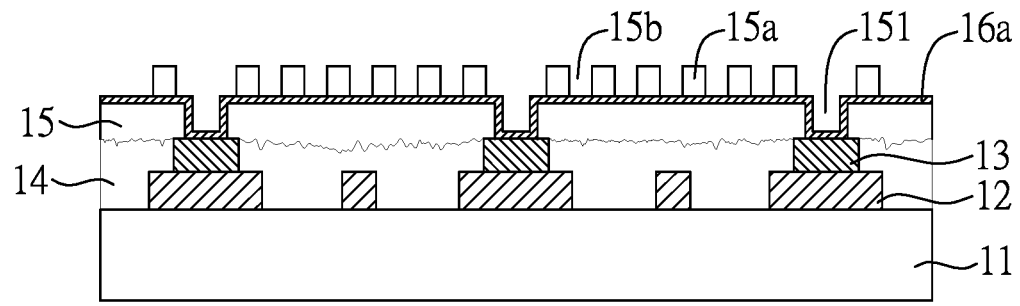
Figure 1K:
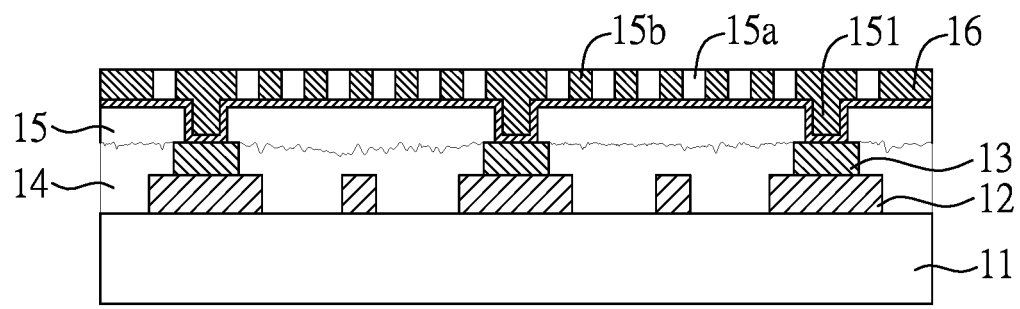
Figure 1L:
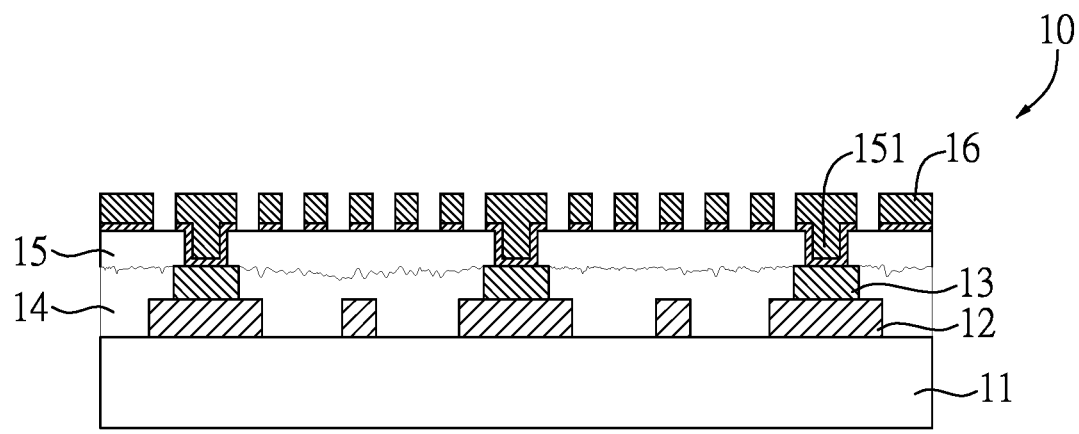

With reference to FIGS. 1I-1L, in the step of "mounting a second circuit layer 16 on the second dielectric layer 15 and in the second dielectric layer opening 151, such that the second circuit layer 16 is electrically connected to the conductive bump 13, and electrically connected to the first circuit layer 12 through the conductive bump 13" further includes the following sub-steps: as shown in FIG. 1I, mounting a seed layer 16a on the second dielectric layer 15 and in the second dielectric layer opening 151; as shown in FIG. 1J, mounting a second photoresist layer 15a on the seed layer 16a, wherein the second photoresist layer 15a has at least one second photoresist layer opening 15b that exposes part of the seed layer 16a and the second dielectric layer opening 151; as shown in FIG. 1K, mounting the second circuit layer 16 in the second photoresist layer opening 15b and the second dielectric layer opening 151; removing the second photoresist layer 15a, as shown in FIG. 1L, performing an etching process to the seed layer 16a and the second circuit layer 16 to separate circuits in the second circuit layer 16 and accomplish the second circuit layer 16.

The circuit board 10 with the first circuit layer 12 and the second circuit layer 16 are accomplished by the manufacture method described above. It should be emphasized that, the thinning process and the roughness of the first dielectric layer 14 are irrelevant to the quality and stability of the second circuit layer 16, because the seed layer 16a is not mounted directly on the first dielectric layer 14, but on the second dielectric layer 15 that covers the first dielectric layer 14. The second dielectric layer opening 151 for conduction is formed by a lithography process, and therefore the surface of the second dielectric layer 15 and the wall in the second dielectric layer opening 151 have a much lower surface roughness. The possibility of voids formed between the seed layer 16a and the second dielectric layer 15 or between the second circuit layer 16 and the seed layer 16a is lowered. The surface of the seed layer 16a is also smoother, which is an advantage for the attaching of the second circuit layer 16.

Namely, a surface of the first dielectric layer 14 combined with the second dielectric layer 15 has a higher roughness than a surface of the second dielectric layer 15 combined with the second circuit layer 16 and a wall in the second dielectric layer opening 151 combined with the second circuit layer 16.

With reference to FIG. 1L, the circuit board 10 of the present invention includes the first circuit layer 12, the conductive bump 13, the first dielectric layer 14, and the second dielectric layer 15. The conductive bump 13 is mounted on the first circuit layer 12. The first dielectric layer 14 covers the first circuit layer 12 and exposes the conductive bump 13. The second dielectric layer 15 covers the second circuit layer 16 and has a second dielectric layer opening 151, wherein the second dielectric layer opening 151 corresponds to the conductive bump 13 and exposes the conductive bump 13. The second circuit layer 16 is mounted on the second dielectric layer 15 and in the second dielectric layer opening 151, and electrically connected to the conductive bump 13 to be electrically connected to the first circuit layer 12 through the conductive bump 13.

Figure 1M:
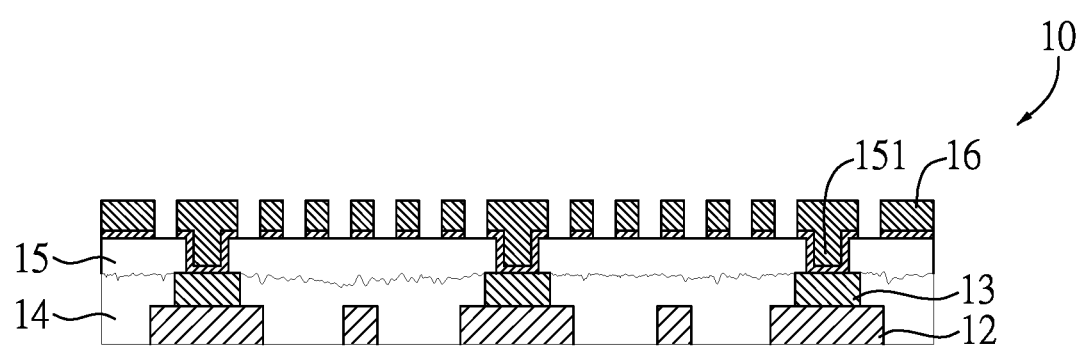

The circuit board 10 may include the substrate 11, that is, the first circuit layer 12 is mounted on the substrate 11 when the manufacture process is accomplished. With reference to FIG. 1M, in another embodiment, the first circuit layer 12 is a buried layer. That is, after mounting the first circuit layer 12 and the build-up circuit layer(s), the substrate 11 is removed, such that the first circuit layer 12 is buried in the first dielectric layer 14.

Preferably, the material of the first dielectric layer 14 is a formulized compound including organic chemicals such as ABF (Ajinomoto Build-up Film), PP (Prepreg), BCB (Benzocylobuthene), BT (Bismaleimide Triazine), liquid crystal polymer, PI (Poly-imide), acrylic resin, polyurethane resin, epoxy resin, phenolic resin, and inorganic compounds such as talcum powder, Barium sulfate, Silicon dioxide, glass fiber, and other additives.

The second dielectric layer 15 is a photosensitive layer. The material of the second dielectric layer 15 is a formulized compound including organic chemicals such as PP (Prepreg), BCB (Benzocylobuthene), BT (Bismaleimide Triazine), liquid crystal polymer, PI(Poly-imide), acrylic resin, polyurethane resin, epoxy resin, polyvinyl ether, (Poly (phenylene ether)), aramide, and other additives.

Figure 2A:
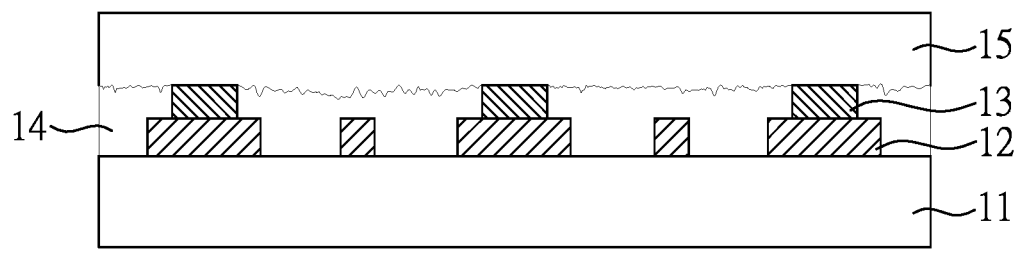
FIGS. 2A-2D are cross-sectional views of a first embodiment of the circuit board manufacture method of the present invention.
Figure 2B:
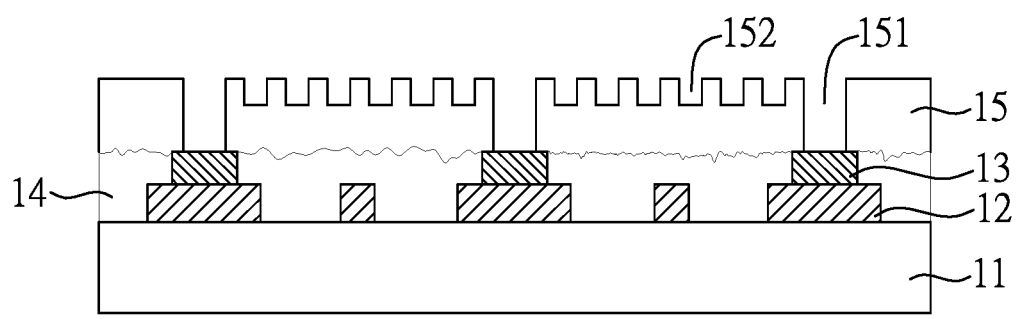

With reference to FIG. 2A and FIG. 2B, in a first embodiment of the present invention, the surface of the second dielectric layer 15 has a patterned groove 152. The step of "mounting a second dielectric layer 15 on the first dielectric layer 14" includes the following sub-steps: as shown in FIG. 2A, mounting the second dielectric layer 15 on the first dielectric layer 14, such that the second dielectric layer 15 covers the first dielectric layer 14 and the conductive bump 13; as shown in FIG. 2B, performing the lithography process on the second dielectric layer 15 and forming the second dielectric layer opening 151 and the patterned groove 152.

Figure 2C:
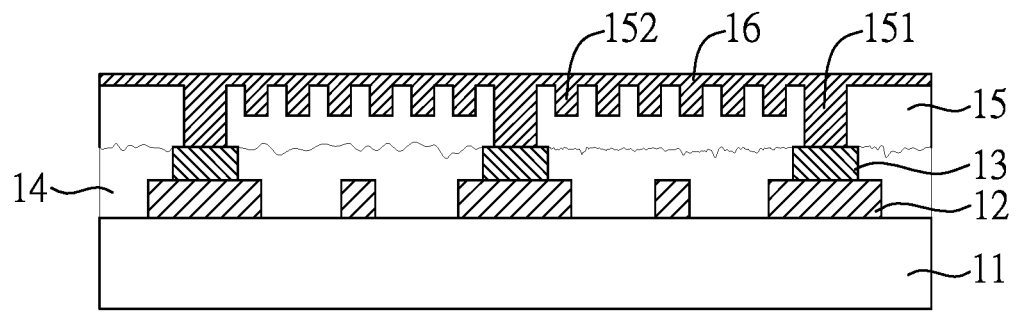
Figure 2D:
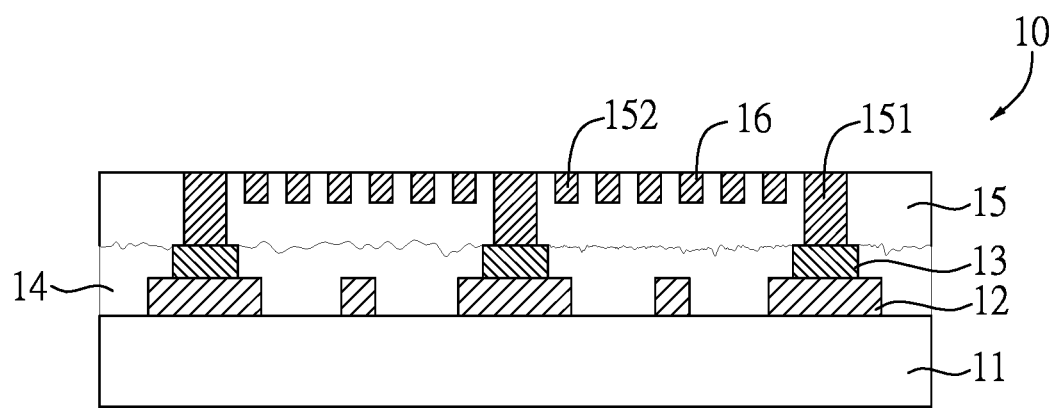

Further with reference to FIG. 2C and FIG. 2D, in the first embodiment, the step of "mounting a second circuit layer 16 on the second dielectric layer 15 and in the second dielectric layer opening 151, such that the second circuit layer 16 is electrically connected to the conductive bump 13, and electrically connected to the first circuit layer 12 through the conductive bump 13" includes the step of forming the second circuit layer 16 in the second dielectric layer opening 151 and the patterned groove 152. To be more specific, as shown in FIG. 2C, first, forming the second circuit layer 16 on the surface of the second dielectric layer 15, in the second dielectric layer opening 151, and in the patterned groove 152; then, as shown in FIG. 2D, removing part of the second circuit layer 16 at the surface to accomplish the second circuit layer 16 in the second dielectric layer opening 151 and the patterned groove 152. Wherein the second circuit layer 16 may be formed by chemical deposition of metal such as copper, or a process with similar outcome. The part of the second circuit layer 16 may be removed by a grinding process, an etching process or a metal thinning process with similar outcome.

In the present embodiment, the second circuit layer 16 is a buried circuit layer. Differential exposure is performed to the second dielectric layer 15 during the lithography process, with the purpose of forming the second dielectric layer opening 151 and the patterned groove 152 of different depths. The pattern of the second circuit layer 16 is set up with the forming of the patterned groove 152, and the forming of the buried second circuit layer 16 is done by mounting the material in the second dielectric layer opening 151 and the patterned groove 152.

Figure 3A:
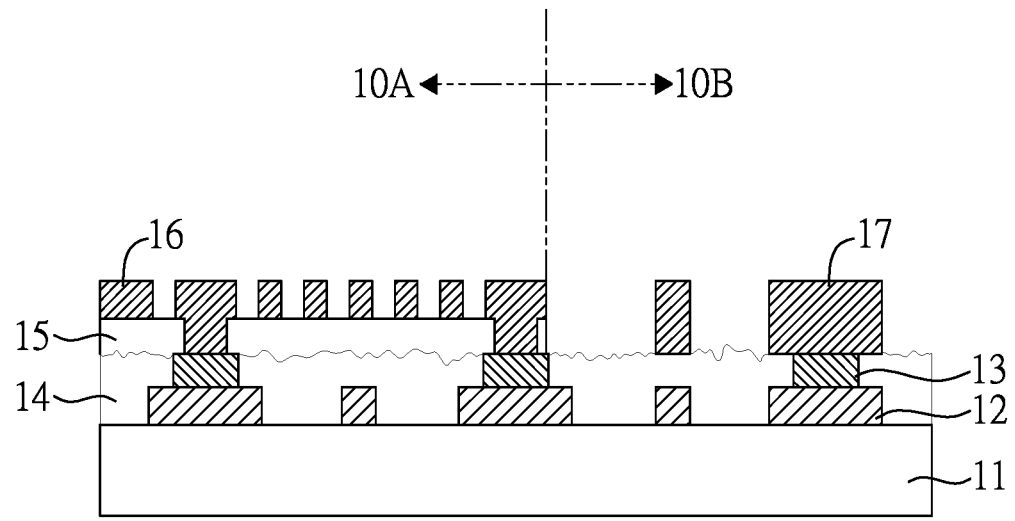
FIGS. 3A-3C are cross-sectional views of a second embodiment of the circuit board manufacture method of the present invention.
Figure 3B:
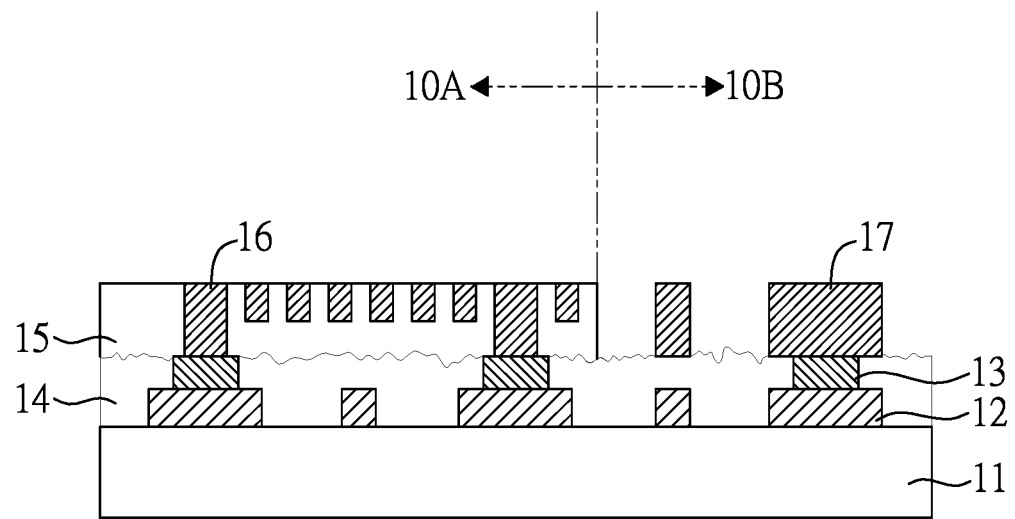

With reference to FIG. 3A and FIG. 3B, in a second embodiment of the present invention, the circuit board 10 has a fine line mounting area 10A and a thick line mounting area 10B, and the second dielectric layer 15 is mounted in the fine line mounting area 10A.

In the present embodiment, after the mounting of the second dielectric layer 15 and the second circuit layer 16, the following steps are further included: as shown in FIG. 3A, mounting a third circuit layer 17 on the first dielectric layer 14 in the thick line mounting area 10B; as shown in FIG. 3B, mounting a third dielectric layer 18 on the first dielectric layer 14 in the fine line mounting area 10A and the thick line mounting area 10B, covering the second dielectric layer 15 and the second circuit layer 16 in the fine line mounting area, and covering the first dielectric layer 14 and the third circuit layer 17 in the thick line mounting area 10B; and mounting a fourth circuit layer 19 on the third dielectric layer 18.

In the present embodiment, the circuit board 10 has the non-overlapping fine line mounting area 10A and thick line mounting area 10B. The second dielectric layer 15 is mounted in the fine line mounting area 10A. The circuit board 10 further includes the third circuit layer 17 that is mounted in the thick line mounting area 10B.

Figure 3C:
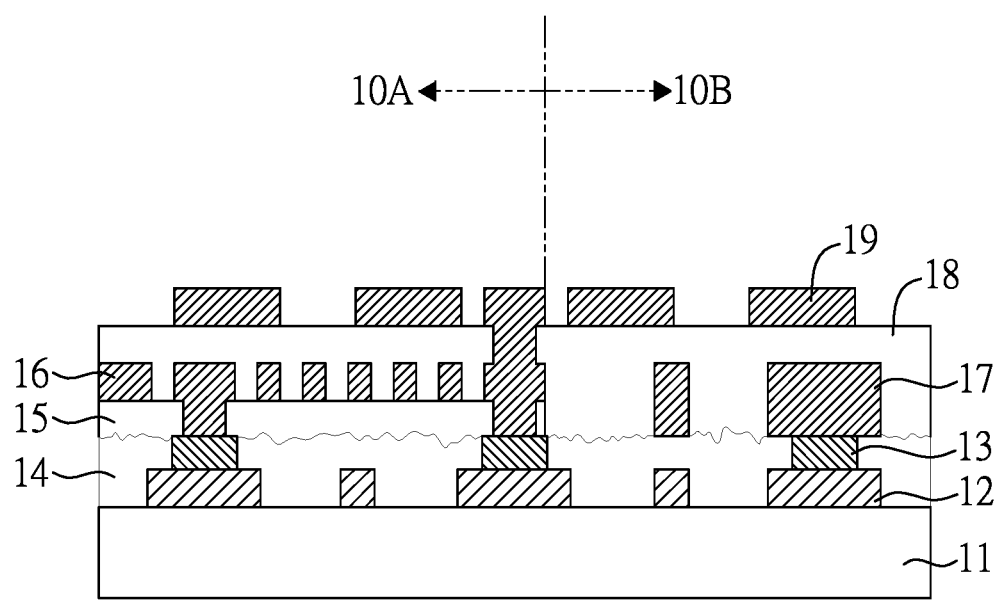
Figure 4A:
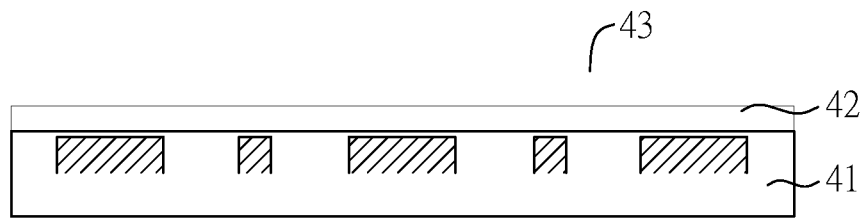
FIGS. 4A-4G are cross-sectional views of a conventional manufacture method of a multilayer circuit board.
Figure 4B:
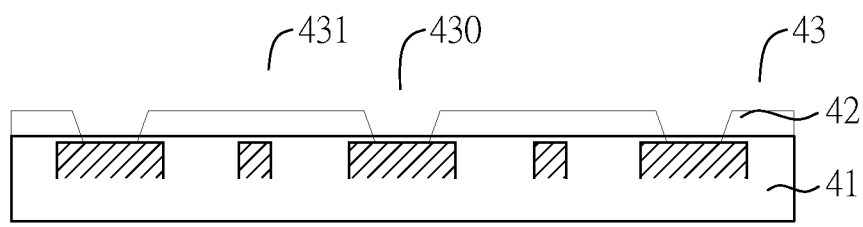
Figure 4C:
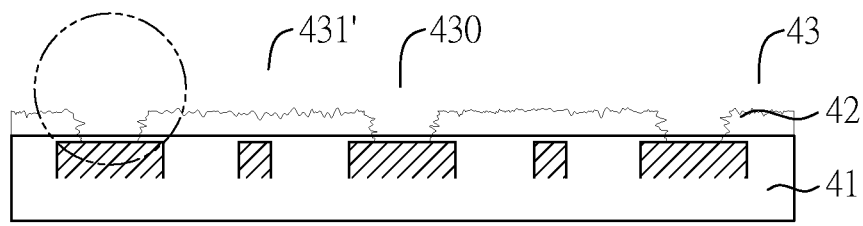
Figure 4D:
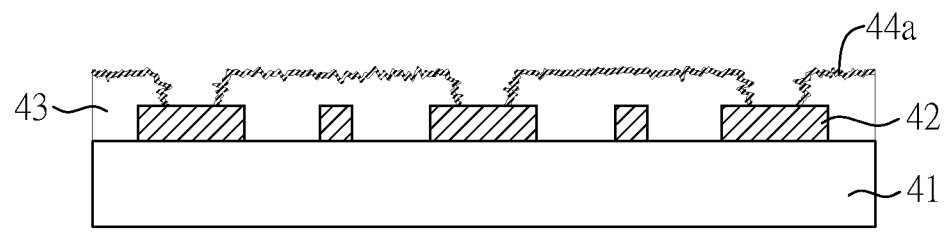
Figure 4E:
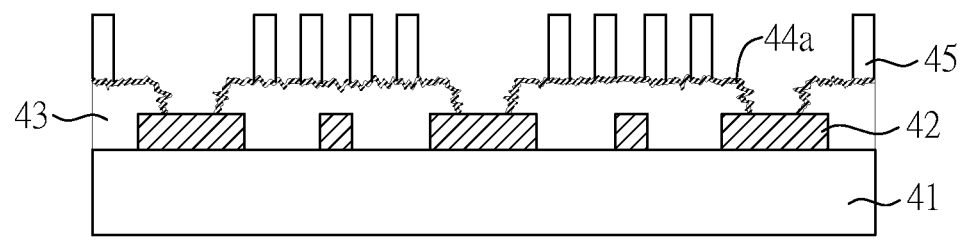
Figure 4F:
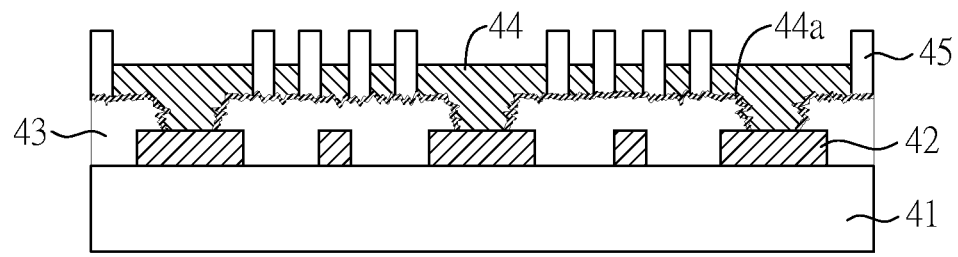
Figure 4G:
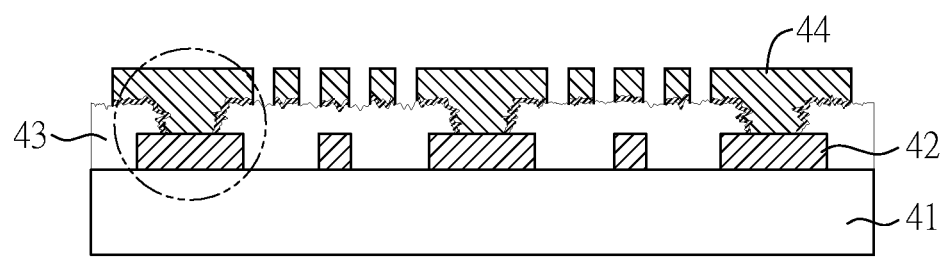
Figure 5A:
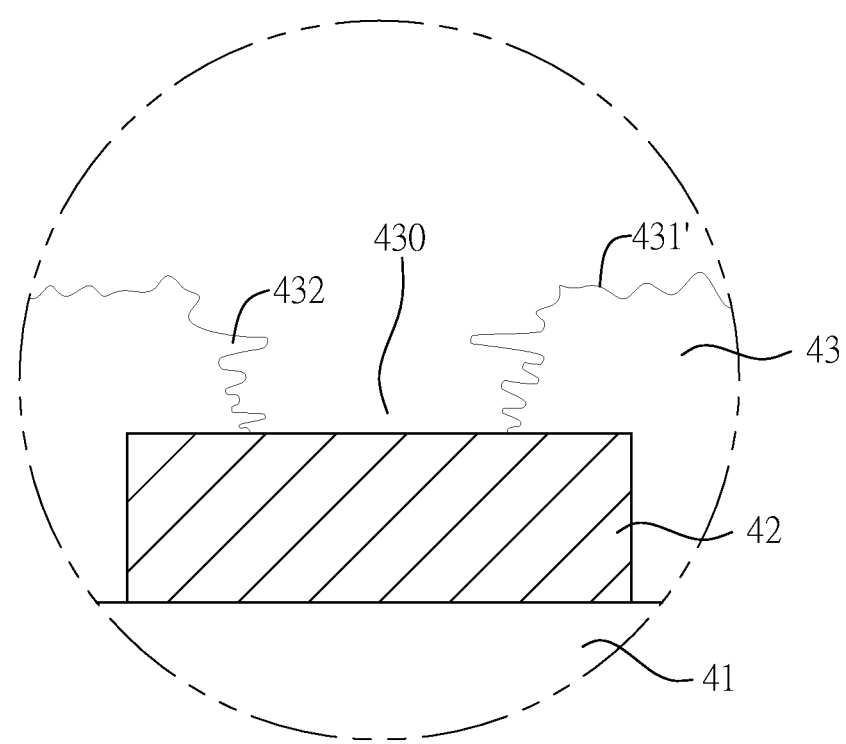
FIG. 5A is a partial enlargement drawing of the cross-sectional view in FIG. 4C.
Figure 5B:
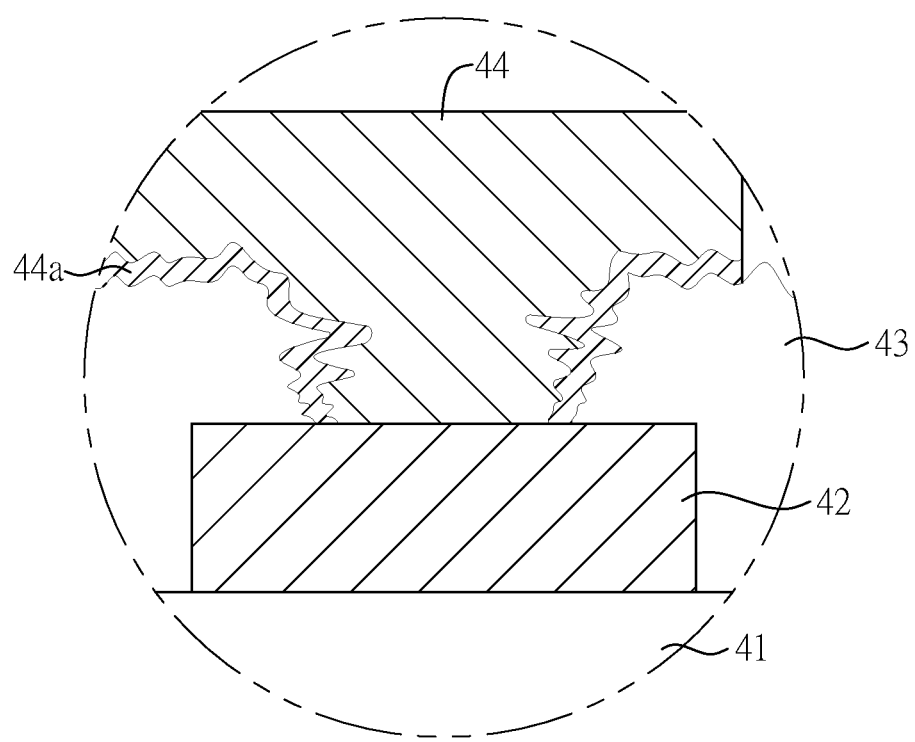
FIG. 5B is a partial enlargement drawing of the cross-sectional view in FIG. 4G.

With reference to FIG. 3C, in the present embodiment, the circuit board 10 further includes a third dielectric layer 18 and a fourth circuit layer 19. The third dielectric layer 18 is mounted on the second dielectric layer 15 and the second circuit layer 16 in the fine line mounting area 10A, and on the first dielectric layer 14 and the third circuit layer 17 in the thick line mounting area 10B. The fourth circuit layer 19 is mounted on the third dielectric layer 18.

In the present embodiment, the second dielectric layer 15 is mounted in the fine line mounting area 10A with the second circuit layer 16 on top, wherein the phrase "fine line" refers to circuit structure with line spacing or diameter of second dielectric layer opening 151 under 10 μm. In the thick line mounting area 10B upon the first dielectric layer 14, the third circuit layer 17 may be mounted. Furthermore, the third dielectric layer 18 may be mounted in both the fine line mounting area 10A and the thick line mounting area 10B on the circuit board 10, and the fourth circuit layer 19 is mounted on the third dielectric layer 18. The mounting process of the fourth circuit layer 19 may utilize a conventional circuit layer build-up method, and the detail thereof is hereby omitted. As a result, the third dielectric layer 18 in the thick line mounting area 10B will be in direct contact and attached to the first dielectric layer 14. Since the surface of the first dielectric layer 14 has a higher roughness, the first dielectric layer 14 and the third dielectric layer 18 have a better interlayer coupling, thereby improving the stableness and structure solidness of the circuit board 10.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:
1. A circuit board, comprising:
   a first circuit layer;
   a conductive bump, mounted on the first circuit layer;
   a first dielectric layer, covering the first circuit layer and exposing the conductive bump;
   a second dielectric layer, covering the first dielectric layer and having a second dielectric layer opening; wherein the second dielectric layer opening corresponds to the conductive bump and exposes the conductive bump;
   a second circuit layer, mounted on the second dielectric layer and in the second dielectric layer opening, and electrically connected to the conductive bump to be electrically connected to the first circuit layer through the conductive bump;
   wherein a surface of the first dielectric layer combined with the second dielectric layer has a higher roughness than a surface of the second dielectric layer combined with the second circuit layer and a wall in the second dielectric layer opening combined with the second circuit layer; wherein the roughness of the surface of the first dielectric layer combined with the second dielectric layer is 0.2-0.5 μm, and the roughness of the surface of the second dielectric layer combined with the second circuit layer and the roughness of the wall surface in the second dielectric layer opening combined with the second circuit layer are 0.02-0.05 μm.
2. The circuit board as claimed in claim 1, wherein the circuit board has a fine line mounting area and a thick line mounting area;

the second dielectric layer is mounted in the fine line mounting area; wherein the circuit board further comprises:

a third circuit layer, mounted on the first dielectric layer in the thick line mounting area.

3. The circuit board as claimed in claim 2, further comprising:

a third dielectric layer, mounted on the second dielectric layer and the second circuit layer in the fine line mounting area, and on the first dielectric layer and the third circuit layer in the thick line mounting area; and a fourth circuit layer, mounted on the third dielectric layer.

4. The circuit board as claimed in claim 1, wherein the first circuit layer is mounted on a substrate.

5. The circuit board as claimed in claim 1, wherein the first circuit layer is buried in the first dielectric layer.

6. The circuit board as claimed in claim 1, wherein the second circuit layer is buried in the second dielectric layer.

\* \* \* \* \*